(12) United States Patent
Zhou et al.

(10) Patent No.: US 9,720,380 B2
(45) Date of Patent: Aug. 1, 2017

(54) TIME-TO-DIGITAL CONVERTER, FREQUENCY TRACKING APPARATUS AND METHOD

(71) Applicant: HUAWEI TECHNOLOGIES CO., LTD., Shenzhen (CN)

(72) Inventors: Shenghua Zhou, Shenzhen (CN); Dongli Song, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/331,109

(22) Filed: Oct. 21, 2016

(65) Prior Publication Data
US 2017/0038738 A1  Feb. 9, 2017

Related U.S. Application Data

(63) Continuation of application No. PCT/CN2014/090265, filed on Nov. 4, 2014.

(30) Foreign Application Priority Data

Apr. 23, 2014 (CN) .......................... 2014 1 0167138

(51) Int. Cl.
*H03M 1/50* (2006.01)
*G04F 10/00* (2006.01)
(Continued)

(52) U.S. Cl.
CPC ............ *G04F 10/005* (2013.01); *H03L 7/085* (2013.01); *H03L 7/087* (2013.01); *H03L 2207/50* (2013.01)

(58) Field of Classification Search
CPC   H03M 1/50; H03M 1/502; H03L 7/08; H03L 7/091; H03L 7/081; H03L 7/0812;
(Continued)

(56) References Cited

U.S. PATENT DOCUMENTS 5,812,626 A * 9/1998 Kusumoto ............. G01R 29/02
                                                              327/271
6,429,693 B1    8/2002 Staszewski et al.
(Continued)

OTHER PUBLICATIONS

International Search Report dated Feb. 17, 2015 in corresponding International Application No. PCT/CN2014/090265.

*Primary Examiner* — Lam T Mai
(74) *Attorney, Agent, or Firm* — Staas & Halsey LLP (57) ABSTRACT

Embodiments of the present invention provide a time-to-digital converter, where the time-to-digital converter includes a delay unit, a first sampling unit, and a second sampling unit. The delay unit is connected to the first sampling unit and is configured to receive a first clock signal and delay the first clock signal; the first sampling unit is configured to perform sampling on the first clock signal and generate a first phase signal, so that a first phase-locked module adjusts a frequency of the first clock signal; the delay unit is further connected to the second sampling unit and is configured to receive a frequency-adjusted first clock signal and delay the frequency-adjusted first clock signal; and the second sampling unit is configured to perform sampling on the frequency-adjusted first clock signal and generate a second phase signal.

12 Claims, 6 Drawing Sheets

(51) Int. Cl.
*H03L 7/085* (2006.01)
*H03L 7/087* (2006.01)

(58) Field of Classification Search
CPC ....... H03L 7/085; H03L 7/087; H04L 7/0331; H04L 7/085; H04L 7/0025; G04F 10/005
USPC ............. 341/150–166; 327/33, 271; 375/376
See application file for complete search history.

(56) References Cited

U.S. PATENT DOCUMENTS

| | | | |
|---|---|---|---|
| 8,471,754 B2* | 6/2013 | Yamamoto | G01R 31/31709 341/155 |
| 9,356,773 B2* | 5/2016 | Zhou | H04L 7/0331 |
| 9,455,854 B2* | 9/2016 | Gao | H04B 1/16 |
| 2009/0112499 A1* | 4/2009 | Chao | G01R 31/31709 702/69 |
| 2010/0259435 A1* | 10/2010 | Yamamoto | G04F 10/005 341/166 |
| 2011/0133973 A1* | 6/2011 | Yamamoto | G01R 31/31709 341/166 |
| 2011/0304357 A1* | 12/2011 | Tokairin | H03K 5/26 327/12 |
| 2012/0069884 A1* | 3/2012 | Sakurai | H03L 7/091 375/224 |
| 2012/0229185 A1* | 9/2012 | Rieubon | H03K 5/159 327/159 |
| 2013/0214959 A1 | 8/2013 | Lee | |
| 2014/0152356 A1* | 6/2014 | Lin | H04L 7/0331 327/155 |
| 2015/0212494 A1* | 7/2015 | Waltari | G04F 10/005 341/166 |
| 2015/0318981 A1* | 11/2015 | Zhou | H04L 7/0331 375/376 |

* cited by examiner

FIG. 1

<Prior Art>

TIME-TO-DIGITAL CONVERTER, FREQUENCY TRACKING APPARATUS AND METHOD

CROSS-REFERENCE TO RELATED APPLICATIONS

This application is a continuation of International Application No. PCT/CN2014/090265, filed on Nov. 4, 2014, which claims priority to Chinese Patent Application No. 201410167138.0, filed on Apr. 23, 2014. The disclosures of the aforementioned applications are hereby incorporated by reference in their entireties.

TECHNICAL FIELD

The present invention relates to the field of electronic technologies, and in particular, to a time-to-digital converter, and a frequency tracking apparatus and method.

BACKGROUND

In a data sending and receiving system, it is needed to generate a clock at a receive end, which is synchronized with that at a transmit end, so as to ensure communication. Before sending data, the transmit end first sends a string of synchronization clock pulses to the receive end, and the receive end locks a receiving frequency of the receive end according to a clock pulse frequency and a time sequence by using a frequency tracking system, so as to remain synchronized with the transmit end throughout a process of data receiving.

Figure 1:
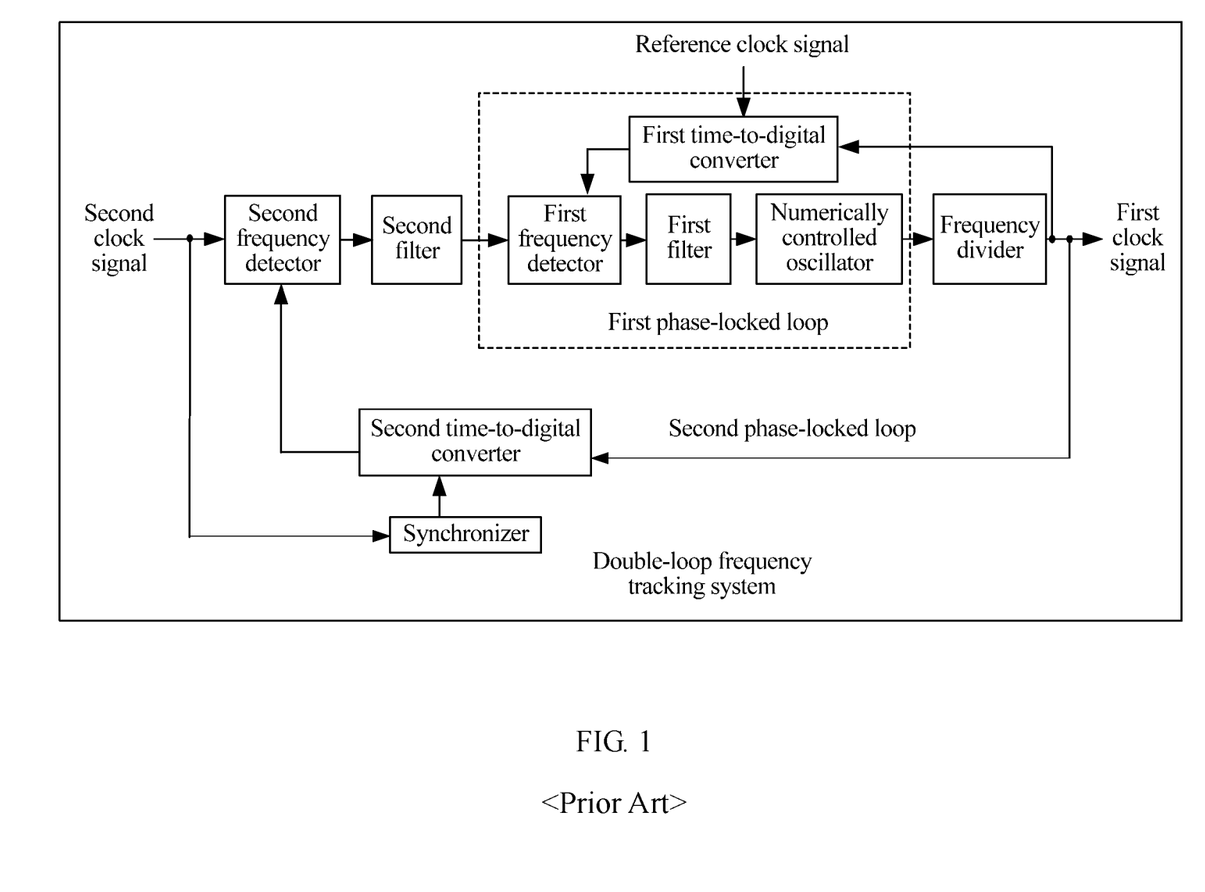
FIG. 1 is a schematic structural diagram of an existing double-loop frequency tracking system.

In the prior art, a double-loop frequency tracking system is generally used to perform frequency tracking on a synchronization clock sent by the transmit end. As shown in FIG. 1, FIG. 1 is a structure diagram of a double-loop frequency tracking system. In FIG. 1, a first clock signal of a numerically controlled oscillator enters a first phase-locked loop; after the first clock signal passes through a first time-to-digital converter, the first time-to-digital converter generates a phase signal according to an input reference clock signal; and a first phase detector and a first filter adjust a frequency of the first clock signal output by the numerically controlled oscillator, so that the frequency of the first clock signal is equal to a frequency of a second clock signal received by a receive end. The first phase-locked loop is generally implemented by an analog method, causing a relatively great error; therefore, a second loop needs to be added outside the first phase-locked loop to track the second clock signal. After the first clock signal enters a second time-to-digital converter of a second phase-locked loop, the second time-to-digital converter generates a phase signal according to the second clock signal, and a second phase detector and a second filter adjust a phase of the first clock signal output by the numerically controlled oscillator, so that the phase of the first clock signal is equal to a phase of the second clock signal, and the error is reduced.

An existing time-to-digital converter includes an array formed by multiple buffers and an array formed by multiple triggers, a clock output by the numerically controlled oscillator passes through each buffer and is transferred backwards, and an output end of each buffer is used as a phase detection point of a trigger array. A frequency of the clock output by the numerically controlled oscillator is relatively high, to achieve frequency coverage, a larger quantity of buffers are required, and correspondingly, a larger quantity of triggers are required; therefore, using two time-to-digital converters may increase energy consumed by the system. In addition, affected by the quantity of buffers and the quantity of triggers, an occupied area of the system is accordingly increased, manufacturing costs are increased, and complexity of system design is also increased.

SUMMARY

Embodiments of the present invention provide a time-to-digital converter, a frequency tracking apparatus and method, an effect of double-loop frequency tracking may be achieved by using one time-to-digital converter, and an occupied area of a double-loop frequency tracking system is reduced.

A first aspect of an embodiment of the present invention provides a time-to-digital converter, including a delay unit, a first sampling unit, and a second sampling unit, where the delay unit is connected to the first sampling unit and is configured to: receive a first clock signal output by a first phase-locked module; and after delaying the first clock signal, output the first clock signal to the first sampling unit;

the first sampling unit is configured to: perform, by using a reference clock signal, sampling on the first clock signal output by the delay unit; generate a first phase signal; and send the first phase signal to the first phase-locked module, so that the first phase-locked module adjusts a frequency of the first clock signal according to the first phase signal, and outputs a frequency-adjusted first clock signal to the delay unit;

the delay unit is further connected to the second sampling unit and is configured to: receive the frequency-adjusted first clock signal output by the first phase-locked module; and after delaying the frequency-adjusted first clock signal, output the frequency-adjusted first clock signal to the second sampling unit; and the second sampling unit is configured to: perform, by using a second clock signal, sampling on the frequency-adjusted first clock signal output by the delay unit; generate a second phase signal; and send the second phase signal to the first phase-locked module by using a second phase-locked module, so that the first phase-locked module adjusts a phase of the first clock signal according to the second phase signal.

With reference to an implementation manner of the first aspect of the embodiment of the present invention, in a first possible implementation manner of the first aspect of the embodiment of the present invention, the delay unit is formed by multiple delay elements that are successively connected, the first sampling unit and the second sampling unit are formed by multiple triggers that are successively connected, and an output end of each delay element is connected to an input end of a next delay element, a phase collecting end of a trigger that is corresponding to the delay element and is in the first sampling unit, and a phase collecting end of a trigger that is corresponding to the delay element and is in the second sampling unit.

With reference to either the first aspect or the first possible implementation manner of the first aspect of the embodiment of the present invention, in a second possible implementation manner of the first aspect of the embodiment of the present invention, a frequency of the reference clock signal is the same as a frequency of the second clock signal.

A second aspect of an embodiment of the present invention provides a frequency tracking apparatus, including a first phase-locked module, a second phase-locked module, and the time-to-digital converter in the first aspect of the embodiment of the present invention, or the first or second possible implementation manner of the first aspect of the embodiment of the present invention, where a first end of the first phase-locked module is connected to the delay unit and is configured to output a first clock signal to the delay unit;

a second end of the first phase-locked module is connected to an end of the second phase-locked module and is configured to receive a second clock signal output by the second phase-locked module;

a third end of the first phase-locked module is connected to the first sampling unit and is configured to: receive a first phase signal output by the first sampling unit; adjust, according to the first phase signal and the second clock signal, a frequency of the first clock signal to be the same as a frequency of the second clock signal; and output a frequency-adjusted first clock signal to the delay unit by using the first end of the first phase-locked module; and another end of the second phase-locked module is connected to an end of the second sampling unit and is configured to receive a second phase signal output by the second sampling unit, so as to control the first phase-locked module to adjust, according to the second phase signal and the second clock signal, a phase of the frequency-adjusted first clock signal to be the same as a phase of the second clock signal, and output a phase-adjusted first clock signal to the delay unit by using the first end of the first phase-locked module.

With reference to an implementation manner of the second aspect of the embodiment of the present invention, in a first possible implementation manner of the second aspect of the embodiment of the present invention, the apparatus further includes a synchronizer, where an end of the synchronizer receives the second clock signal, another end of the synchronizer is connected to another end of the second sampling unit, and the synchronizer is configured to change a time sequence of the second clock signal, and output, to the second sampling unit, a second clock signal obtained after the time sequence is changed.

With reference to an implementation manner of the second aspect of the embodiment of the present invention, in a second possible implementation manner of the second aspect of the embodiment of the present invention, the first phase-locked module includes a first phase detector, a first filter, a numerically controlled oscillator, and a frequency divider, where the first phase detector includes a first input end, a second input end, and an output end;

the first filter includes an input end and an output end;

the numerically controlled oscillator includes an input end and an output end;

the frequency divider includes an input end and an output end;

the first input end of the first phase detector is the second end of the first phase-locked module, the second input end of the first phase detector is the third end of the first phase-locked module, the output end of the first phase detector is connected to the input end of the first filter, and the first phase detector is configured to calculate a frequency error between the first clock signal and the second clock signal according to the first phase signal and the second clock signal;

the output end of the first filter is connected to the input end of the numerically controlled oscillator, and the first filter is configured to control, according to the frequency error, the numerically controlled oscillator to adjust the first clock signal;

the output end of the numerically controlled oscillator is connected to the input end of the frequency divider, and the numerically controlled oscillator is configured to adjust, according to the frequency error, the frequency of the first clock signal to be the same as the frequency of the second clock signal; and the output end of the frequency divider is the first end of the first phase-locked module, and the frequency divider is configured to perform frequency division on the frequency-adjusted first clock signal.

With reference to any one of the second aspect to the second possible implementation manner of the second aspect of the embodiment of the present invention, in a third possible implementation manner of the second aspect of the embodiment of the present invention, the second phase-locked module includes a second phase detector and a second filter, where the second phase detector includes an input end and an output end;

the second filter includes an input end and an output end;

the input end of the second phase detector is the another end of the second phase-locked module, the output end of the second phase detector is connected to the input end of the second filter, and the second phase detector is configured to calculate a phase error between the frequency-adjusted first clock signal and the second clock signal according to the second phase signal and the input second clock signal; and the output end of the second filter is the end of the second phase-locked module, and the second filter is configured to control the numerically controlled oscillator according to the phase error, so that the numerically controlled oscillator adjusts, according to the phase error, the phase of the frequency-adjusted first clock signal to be the same as the phase of the second clock signal.

A third aspect of an embodiment of the present invention provides a frequency tracking method, including:

receiving, by a delay unit, a first clock signal output by a first phase-locked module; and after delaying the first clock signal, outputting the first clock signal to a first sampling unit;

performing, by the first sampling unit by using a reference clock signal, sampling on the first clock signal output by the delay unit; generating a first phase signal; and sending the first phase signal to the first phase-locked module, so that the first phase-locked module adjusts a frequency of the first clock signal according to the first phase signal, and outputs a frequency-adjusted first clock signal to the delay unit;

receiving, by the delay unit, the frequency-adjusted first clock signal output by the first phase-locked module; and after delaying the frequency-adjusted first clock signal, outputting the frequency-adjusted first clock signal to a second sampling unit; and performing, by the second sampling unit by using a second clock signal, sampling on the frequency-adjusted first clock signal output by the delay unit; generating a second phase signal; and sending the second phase signal to the first phase-locked module by using a second phase-locked module, so that the first phase-locked module adjusts a phase of the first clock signal according to the second phase signal.

With reference to an implementation manner of the third aspect of the embodiment of the present invention, in a first possible implementation manner of the third aspect of the embodiment of the present invention, a frequency of the reference clock signal is the same as a frequency of the second clock signal.

With reference to an implementation manner of the third aspect of the embodiment of the present invention, in a second possible implementation manner of the third aspect of the embodiment of the present invention, the second clock signal received by the second sampling unit is a second clock signal obtained after a synchronizer changes a time sequence.

With reference to either the third aspect or the first possible implementation manner of the third aspect of the embodiment of the present invention, in a third possible implementation manner of the third aspect of the embodiment of the present invention, the adjusting, by the first phase-locked module, a frequency of the first clock signal according to the first phase signal includes:

calculating, by a first phase detector of the first phase-locked module, a frequency error between the first clock signal and the second clock signal according to the first phase signal and the second clock signal;

controlling, by a first filter of the first phase-locked module according to the frequency error, a numerically controlled oscillator of the first phase-locked module to adjust the first clock signal;

adjusting, by the numerically controlled oscillator according to the frequency error, the frequency of the first clock signal to be the same as the frequency of the second clock signal; and performing, by a frequency divider of the first phase-locked module, frequency division on the frequency-adjusted first clock signal.

With reference to an implementation manner of the third aspect of the embodiment of the present invention, in a fourth possible implementation manner of the third aspect of the embodiment of the present invention, the adjusting, by the first phase-locked module, a phase of the first clock signal according to the second phase signal includes:

calculating, by a second phase detector of the second phase-locked module, a phase error between the frequency-adjusted first clock signal and the second clock signal according to the second phase signal and the second clock signal; and controlling, by a second filter of the first phase-locked module, the numerically controlled oscillator according to the phase error, so that the numerically controlled oscillator adjusts, according to the phase error, a phase of the frequency-adjusted first clock signal to be the same as a phase of the second clock signal.

By using the embodiments of the present invention, one sampling unit that includes multiple triggers can be added on the basis of an inner structure of a time-to-digital converter; therefore, a function of each of two time-to-digital converters in an existing double-loop frequency tracking system is implemented by using one time-to-digital converter, brand-new architecture is provided for the double-loop frequency tracking system, and power consumption and an occupied area of the system are reduced.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

Embodiments of the present invention provide a time-to-digital converter, a frequency tracking apparatus and method, an effect of double-loop frequency tracking may be achieved by using one time-to-digital converter, and an occupied area of a double-loop frequency tracking system is reduced.

Figure 2:
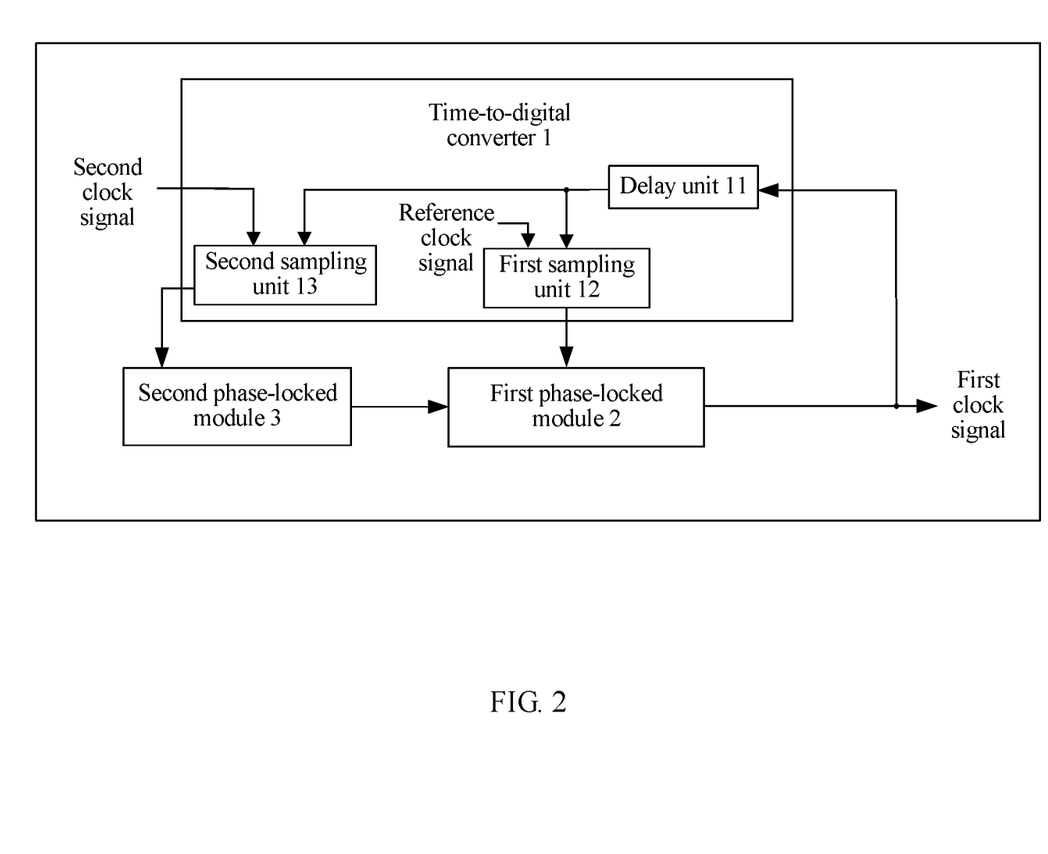
FIG. 2 is a schematic structural diagram of an embodiment of a time-to-digital converter according to an embodiment of the present invention.

Referring to FIG. 2, FIG. 2 is a schematic structural diagram of an embodiment of a time-to-digital converter according to an embodiment of the present invention. In this embodiment of the present invention, an inner structure of a time-to-digital converter 1 is reconstructed, and a group of trigger array is added, so as to implement a function of each of two time-to-digital converters in an existing double-loop frequency tracking system. A delay element involved in this embodiment of the present invention may be any passive component such as a buffer, an inductor, a resistor, and a capacitor, designed for providing signal delay, and in this embodiment of the present invention, the buffer is used as an example for description. As shown in FIG. 2, the time-to-digital converter 1 includes a delay unit 11, a first sampling unit 12, and a second sampling unit 13.

The delay unit 11 is connected to the first sampling unit 12 and is configured to: receive a first clock signal output by a first phase-locked module 2; and after delaying the first clock signal, output the first clock signal to the first sampling unit 12.

The first sampling unit 12 is configured to: perform, by using a reference clock signal, sampling on the first clock signal output by the delay unit 11; generate a first phase signal; and send the first phase signal to the first phase-locked module 2, so that the first phase-locked module 2 adjusts a frequency of the first clock signal according to the first phase signal, and outputs a frequency-adjusted first clock signal to the delay unit 11.

The delay unit 11 is further connected to the second sampling unit 13 and is configured to: receive the frequency-adjusted first clock signal output by the first phase-locked module 2; and after delaying the frequency-adjusted first clock signal, output the frequency-adjusted first clock signal to the second sampling unit 13.

The second sampling unit 13 is configured to: perform, by using a second clock signal, sampling on the frequency-adjusted first clock signal output by the delay unit 11; generate a second phase signal; and send the second phase signal to the first phase-locked module 2 by using a second phase-locked module 3, so that the first phase-locked module 2 adjusts a phase of the first clock signal according to the second phase signal.

In specific implementation, the first clock signal is an input clock signal of the delay unit 11, and is generally a high-frequency clock. In an initial state, the delay unit 11 delays the first clock signal output by the first phase-locked module 2, and outputs the first clock signal to the first sampling unit 12; the first phase-locked module 2 to which the first sampling unit 12 is connected performs frequency adjustment on the delayed first clock signal, and feeds back the frequency-adjusted first clock signal to the delay unit 11; in this case, the delay unit 11 continues to delay the frequency-adjusted first clock signal, and output the frequency-adjusted first clock signal to the second sampling unit 13.

Figure 3:
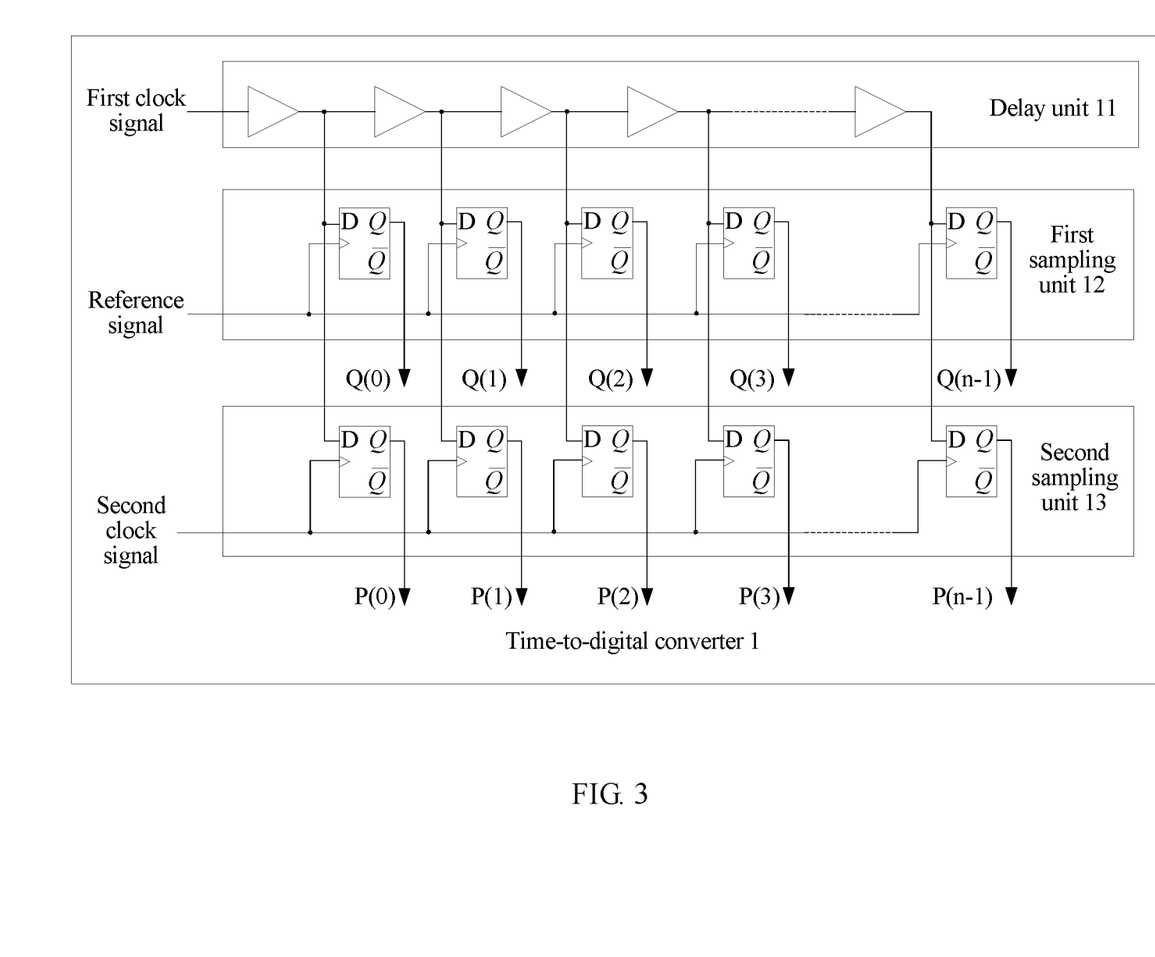
FIG. 3 is a specific schematic structural diagram of an embodiment of a part of a time-to-digital converter according to an embodiment of the present invention.

Optionally, refer to a specific schematic structural diagram that is of a part of the time-to-digital converter 1 and that is shown in FIG. 3. The delay unit 11 includes multiple delay elements that are successively connected, the first sampling unit 12 and the second sampling unit 13 separately includes multiple triggers that are successively connected, and an output end of each delay element is connected to an input end of a next delay element, a phase collecting end of a trigger that is corresponding to the delay element and is in the first sampling unit 12, and a phase collecting end of a trigger that is corresponding to the delay element and is in the second sampling unit 13. A common node of a delay element and a connected trigger is a phase detection point.

Optionally, a frequency of the reference clock signal is the same as a frequency of the second clock signal.

In specific implementation, in the first sampling unit 12, a signal input end of each trigger receives the reference clock signal, and the frequency of the reference clock signal is the same as the frequency of the second clock signal. When the input reference clock signal triggers an operation of phase collection (as shown in FIG. 3, the reference clock signal triggers the operation of phase collection by using a rising edge), a phase collecting end of each trigger performs signal sampling on a phase detection point of a corresponding delay element, and corresponding phase values Q(0) to Q(n−1) are output and stored. The first phase signal is output in a string of code formed by all of the phase values, and the first phase signal is sent to the first phase-locked module 2, so that the first phase-locked module 2 adjusts the frequency of the first clock signal according to the first phase signal, and outputs the frequency-adjusted first clock signal to the delay unit 11.

In an implementable manner, the phase values output by all triggers are converted by using an encoder to form the string of code, and the first phase signal is output.

In specific implementation, in the second sampling unit 13, a signal input end of each trigger receives the second clock signal. Being the same as a working principle of the first sampling unit 12, when the input second clock signal triggers an operation of phase collection, a phase collecting end of each trigger performs signal sampling on a phase detection point of a corresponding delay element, that is, the phase collecting end of each trigger performs sampling on the frequency-adjusted first clock signal, and corresponding phase values P(0) to P(n−1) are output and stored. The second phase signal is output in a string of code formed by all of the phase values, and is sent to the first phase-locked module 2 by using the second phase-locked module 3, so that the first phase-locked module 2 adjusts the phase of the first clock signal according to the second phase signal, and finally, the first clock signal is made be synchronized with the second clock signal.

In an implementable manner, the phase values output by all triggers are converted by using an encoder to form the string of code, and the second phase signal is output.

By using the time-to-digital converter described in FIG. 2, one sampling unit that includes multiple triggers can be added on the basis of an inner structure of the time-to-digital converter; therefore, a function of each of two time-to-digital converters in an existing double-loop frequency tracking system and a function of each component of a loop of the double-loop frequency tracking system are implemented by using one time-to-digital converter, and power consumption and an occupied area of the system are reduced.

Figure 4:
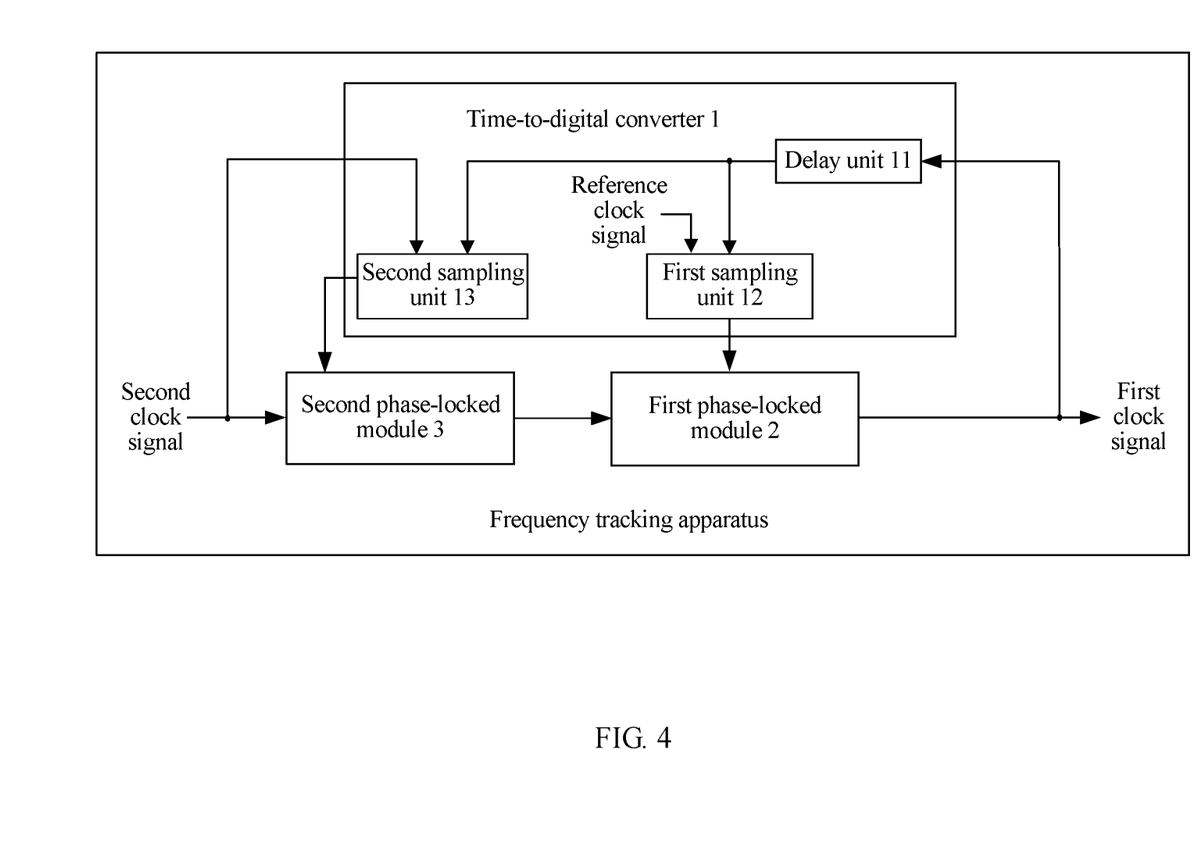
FIG. 4 is a schematic structural diagram of an embodiment of a frequency tracking apparatus according to an embodiment of the present invention.

Referring to FIG. 4, FIG. 4 is a schematic structural diagram of an embodiment of a frequency tracking apparatus according to an embodiment of the present invention. The frequency tracking apparatus provided in this embodiment of the present invention includes a first phase-locked module 2, a second phase-locked module 3, and the time-to-digital converter 1 described in the embodiments shown in FIG. 2 and FIG. 3.

A first end of the first phase-locked module 2 is connected to a delay unit 11 and is configured to output a first clock signal to the delay unit 11.

A second end of the first phase-locked module 2 is connected to an end of the second phase-locked module 3 and is configured to receive a second clock signal output by the second phase-locked module 3.

A third end of the first phase-locked module 2 is connected to a first sampling unit 12 and is configured to: receive a first phase signal output by the first sampling unit 12; adjust, according to the first phase signal and the second clock signal, a frequency of the first clock signal to be the same as a frequency of the second clock signal; and output a frequency-adjusted first clock signal to the delay unit 11 by using the first end of the first phase-locked module 2.

Another end of the second phase-locked module 3 is connected to an end of a second sampling unit 13 and is configured to receive a second phase signal output by the second sampling unit 13, so as to control the first phase-locked module 2 to adjust, according to the second phase signal and the second clock signal, a phase of the frequency-adjusted first clock signal to be the same as a phase of the second clock signal, and output a phase-adjusted first clock signal to the delay unit 11 by using the first end of the first phase-locked module 2.

In specific implementation, the second phase-locked module 3 outputs the input second clock signal to the second end of the first phase-locked module 2; therefore, the first phase-locked module 2 can discriminate phase information of the second clock signal, and then the first phase-locked module 2 generates the first clock signal according to the second clock signal, and outputs the first clock signal to the delay unit 11 by using the first end of the first phase-locked module 2.

In an implementable manner, the phase information of the second clock signal may also be discriminated by the second phase-locked module 3 and output to the first phase-locked module 2.

In specific implementation, after the first clock signal is delayed by the delay unit 11, the first sampling unit 12 performs sampling on the first clock signal, generates the first phase signal, and inputs the first phase signal to the third end of the first phase-locked module 2. The first phase-locked module 2 discriminates the first phase signal, and adjusts, according to the first phase signal and the phase information of the second clock signal, the frequency of the first clock signal to be the same as the frequency of the second clock signal. For a specific process of generating the first phase signal by the first sampling unit 12, reference is made to the embodiment shown in FIG. 2 for details, which is not repeatedly described in this embodiment.

In specific implementation, after the first phase-locked module 2 adjusts the frequency of the first clock signal, the frequency-adjusted first clock signal is output to the delay unit 11, and the second sampling unit 13 performs sampling on the frequency-adjusted first clock signal, generates the second phase signal, and outputs the second phase signal to the another end of the second phase-locked module 3. The second phase-locked module 3 discriminates the second phase signal, and outputs the discriminated second phase signal to the second end of the first phase-locked module 2, so that the first phase-locked module 2 adjusts, according to the second phase signal and the phase information of the second clock signal, the phase of the frequency-adjusted first clock signal to be the same as the phase of the second clock. For a specific process of generating the second phase signal by the second sampling unit 13, reference is made to the embodiment shown in FIG. 2 for details, which is not repeatedly described in this embodiment.

By using the apparatus described in FIG. 4, one sampling unit that includes multiple triggers can be added on the basis of an inner structure of a time-to-digital converter; therefore, a function of each of two time-to-digital converters in an existing double-loop frequency tracking system can be implemented, brand-new architecture is provided for the double-loop frequency tracking system, and power consumption and an occupied area of the system are reduced.

Figure 5:
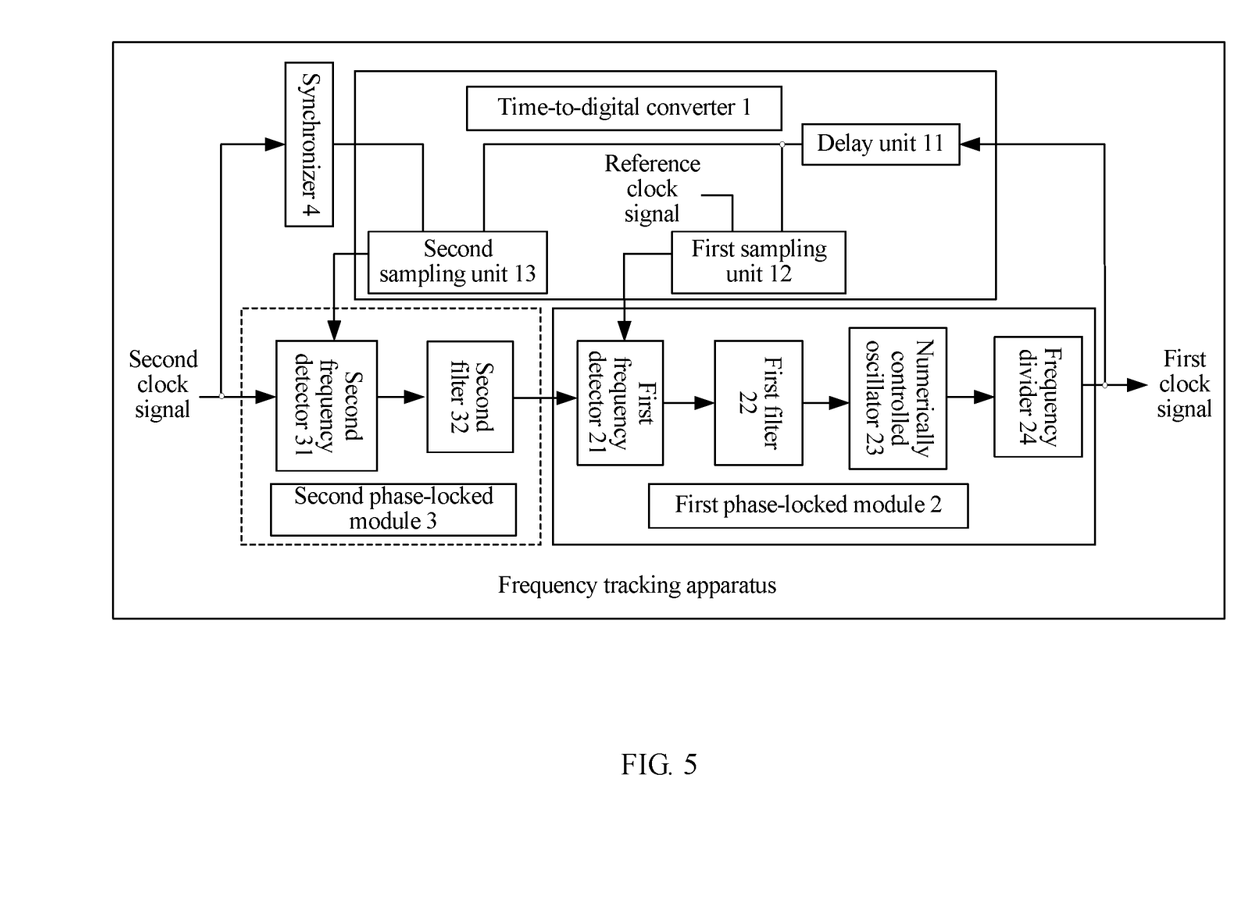
FIG. 5 is a schematic structural diagram of another embodiment of a frequency tracking apparatus according to an embodiment of the present invention.

Referring to FIG. 5, FIG. 5 is a schematic structural diagram of another embodiment of a frequency tracking apparatus according to an embodiment of the present invention. As shown in FIG. 5, the frequency tracking apparatus provided in this embodiment of the present invention includes a first phase-locked module 2, a second phase-locked module 3, and the time-to-digital converter 1 described in embodiments shown in FIG. 2 and FIG. 3. A first end of the first phase-locked module 2 is connected to a delay unit 11 and is configured to output a first clock signal to the delay unit 11. A second end of the first phase-locked module 2 is connected to an end of the second phase-locked module 3 and is configured to receive a second clock signal output by the second phase-locked module 3. A third end of the first phase-locked module 2 is connected to a first sampling unit 12 and is configured to: receive a first phase signal output by the first sampling unit 12; adjust, according to the first phase signal and the second clock signal, a frequency of the first clock signal to be the same as a frequency of the second clock signal; and output a frequency-adjusted first clock signal to the delay unit 11 by using the first end of the first phase-locked module 2. Another end of the second phase-locked module 3 is connected to an end of a second sampling unit 13 and is configured to receive a second phase signal output by the second sampling unit 13, so as to control the first phase-locked module 2 to adjust, according to the second phase signal and the second clock signal, a phase of the frequency-adjusted first clock signal to be the same as a phase of the second clock signal, and output a phase-adjusted first clock signal to the delay unit 11 by using the first end of the first phase-locked module 2.

Optionally, the apparatus further includes a synchronizer 4, where an end of the synchronizer 4 receives the second clock signal, another end of the synchronizer 4 is connected to the second sampling unit 13, and the synchronizer 4 is configured to change a time sequence of the second clock signal, and output, to the second sampling unit 13, a second clock signal obtained after the time sequence is changed. Because the first clock signal obtained by the second sampling unit 13 from the delay unit 11 is a delayed clock signal, the synchronizer 4 needs to change the time sequence of the input second clock signal to match the delayed first clock signal, so as to ensure that the first clock signal subsequently output by the first phase-locked module 2 is synchronized with the second clock signal.

Optionally, the first phase-locked module 2 includes a first phase detector 21, a first filter 22, a numerically controlled oscillator 23, and a frequency divider 24. The first phase detector 21 includes a first input end, a second input end, and an output end; the first filter 22 includes an input end and an output end; the numerically controlled oscillator 23 includes an input end and an output end; and the frequency divider 24 includes an input end and an output end.

Optionally, the first input end of the first phase detector 21 is the second end of the first phase-locked module 2, the second input end of the first phase detector 21 is the third end of the first phase-locked module 2, the output end of the first phase detector 21 is connected to the input end of the first filter 22, and the first phase detector 21 is configured to calculate a frequency error between the first clock signal and the second clock signal according to the first phase signal and the second clock signal. The first phase detector 21 discriminates the first phase signal and phase information of the second clock signal, compares a phase of first clock signal and the phase of the second clock signal, calculates the frequency error between the first clock signal and the second clock signal, and outputs a frequency error voltage.

Optionally, the output end of the first filter 22 is connected to the input end of the numerically controlled oscillator 23, and the first filter 22 is configured to control, according to the frequency error, the numerically controlled oscillator 23 to adjust the first clock signal. After the first filter 22 performs filtering on the frequency error voltage output by the first phase detector 21, a control voltage is obtained and output to the numerically controlled oscillator 23.

Optionally, the output end of the numerically controlled oscillator 23 is connected to the input end of the frequency divider 24, and the numerically controlled oscillator 23 is configured to adjust, according to the frequency error, the frequency of the first clock signal to be the same as the frequency of the second clock signal. The control voltage output by the first filter 22 acts on the numerically controlled oscillator 23, so that the numerically controlled oscillator 23 adjusts an oscillation frequency (that is, the frequency of the first clock signal) to be the same as the frequency of the second clock signal, where the oscillation frequency is output by the numerically controlled oscillator 23. When the two frequencies are equal, a loop of the first phase-locked module 2 is locked, and the frequency of the output first clock signal keeps the same with the frequency of the second clock signal.

Optionally, the output end of the frequency divider 24 is the first end of the first phase-locked module 2, and the frequency divider 24 is configured to perform frequency division on the frequency-adjusted first clock signal. The frequency divider 24 performs frequency division on the frequency-adjusted first clock signal and adjusts a relationship between related coefficients, so that a first clock signal whose frequency is divided by the frequency divider 24 can match a related coefficients of a reference clock input by the first sampling unit 12, which facilitates sampling performed by the first sampling unit 12.

In an implementable manner, after being discriminated by a second phase detector 31 of the second phase-locked module 3, the phase information of the second clock signal may be output to the first phase detector 21 by using a second filter 32.

Optionally, the second phase-locked module 3 includes the second phase detector 31 and the second filter 32, where the second phase detector 31 includes an input end and an output end, and the second filter 32 includes an input end and an output end.

Optionally, the input end of the second phase detector 31 is the another end of the second phase-locked module 3, the output end of the second phase detector 31 is connected to the input end of the second filter 32, and the second phase detector 31 is configured to calculate a phase error between the frequency-adjusted first clock signal and the second clock signal according to the second phase signal and the input second clock signal. A working principle of the second phase detector 31 is the same as that of the first phase detector 21, and the second phase detector 31 is configured to: discriminate the second phase signal and the phase information of the second clock signal, compare the phase of the frequency-adjusted first clock signal and the phase of the second clock signal, calculate the phase error between the frequency-adjusted first clock signal and the second clock signal, and output a phase error voltage.

Optionally, the output end of the second filter 32 is an end of the second phase-locked module 3, and the second filter 32 is configured to control the numerically controlled oscillator 23 according to the phase error, so that the numerically controlled oscillator 23 adjusts, according to the phase error, the phase of the frequency-adjusted first clock signal to be the same as the phase of the second clock signal. After the second filter 32 performs filtering on the phase error voltage output by the second phase detector 31, a control voltage is obtained and acts on the numerically controlled oscillator 23 of the first phase-locked module 2, so that the phase of the first clock signal output by the numerically controlled oscillator 23 is the same as the phase of the second clock signal. In this case, a loop of the second phase-locked module 3 is locked, and the output first clock signal is synchronized with the second clock signal.

In specific implementation, a working principle of the apparatus provided in this embodiment of the present invention is generally as follows:

A second clock signal is input to the first phase-locked module 2 by using the second phase-locked module 3, and the numerically controlled oscillator 23 outputs a first clock signal in an oscillatory manner. Because a specific error exists in the numerically controlled oscillator 23, the first clock signal cannot be synchronized with the second clock signal, and the numerically controlled oscillator 23 outputs the first clock signal to the delay unit 11 of the time-to-digital converter 1. The delay unit 11 includes multiple delay elements and is configured to delay the first clock signal. The first sampling unit 12 performs sampling on the first clock signal and generates a first phase signal. The first sampling unit 12 outputs the first phase signal to the first phase detector 21. The first phase detector 21 discriminates a phase of the second clock signal and the first phase signal, calculates a frequency error between the first clock signal and the second clock signal, and outputs a frequency error voltage to the first filter 22. After performing filtering, the first filter 22 controls the numerically controlled oscillator 23 to adjust a frequency of the first clock signal, until the frequency of the first clock signal is the same as a frequency of the second clock signal, and then a loop of the first phase-locked module 2 is locked.

After performing frequency adjustment on the first clock signal, the numerically controlled oscillator 23 outputs a adjusted first clock signal to the delay unit 11 of the time-to-digital converter 1 again. The delay unit 11 delays the frequency-adjusted first clock signal. The second sampling unit 13 performs sampling on the frequency-adjusted first clock signal and generates a second phase signal. The second sampling unit 13 outputs the second phase signal to the second phase detector 31. The second phase detector 31 discriminates the phase of the second clock signal and the second phase signal, calculates a phase error between the frequency-adjusted first clock signal and the second clock signal, and outputs a phase error voltage to the second filter 32. After performing filtering, the second filter 32 controls the numerically controlled oscillator 23 to adjust a phase of the first clock signal, until the phase of the first clock signal is the same as the phase of the second clock signal, and then a loop of the second phase-locked module 3 is locked. Finally, the first clock signal is made to remain synchronized with the second clock signal.

By using the apparatus described in FIG. 5, a function of each of two time-to-digital converters in an existing double-loop frequency tracking system and a function of each component of a loop of the double-loop frequency tracking system can be implemented by using one time-to-digital converter, brand-new architecture is provided for the double-loop frequency tracking system, and power consumption and an occupied area of the system are reduced.

Figure 6:
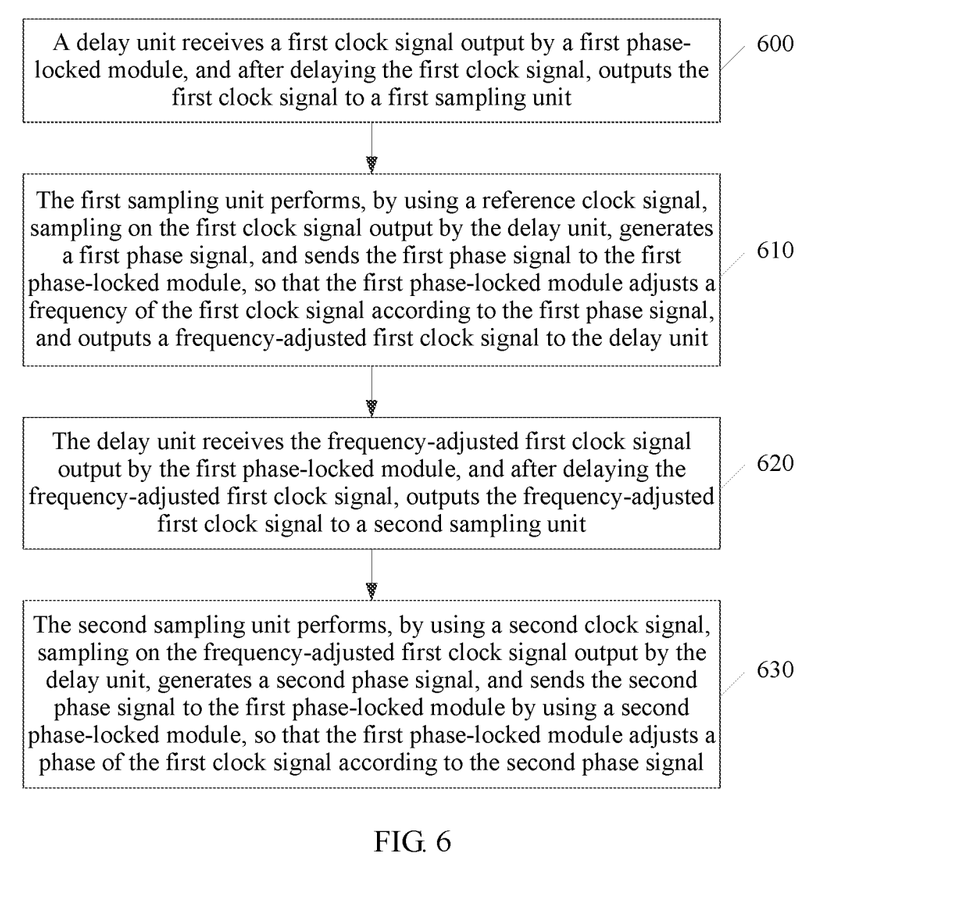
FIG. 6 is a schematic flowchart of an embodiment of a frequency tracking method according to an embodiment of the present invention.

Referring to FIG. 6, FIG. 6 is a schematic flowchart of an embodiment of a frequency tracking method according to an embodiment of the present invention. Components involved in the method embodiment shown in FIG. 6 are described components for implementing FIG. 2 to FIG. 5. As shown in FIG. 6, the frequency tracking method in this embodiment of the present invention may include the following steps:

600. A delay unit receives a first clock signal output by a first phase-locked module, and after delaying the first clock signal, outputs the first clock signal to a first sampling unit.

610. The first sampling unit performs, by using a reference clock signal, sampling on the first clock signal output by the delay unit, generates a first phase signal, and sends the first phase signal to the first phase-locked module, so that the first phase-locked module adjusts a frequency of the first clock signal according to the first phase signal, and outputs a frequency-adjusted first clock signal to the delay unit.

620. The delay unit receives the frequency-adjusted first clock signal output by the first phase-locked module, and after delaying the frequency-adjusted first clock signal, outputs the frequency-adjusted first clock signal to a second sampling unit.

630. The second sampling unit performs, by using a second clock signal, sampling on the frequency-adjusted first clock signal output by the delay unit, generates a second phase signal, and sends the second phase signal to the first phase-locked module by using a second phase-locked module, so that the first phase-locked module adjusts a phase of the first clock signal according to the second phase signal.

In specific implementation, referring to FIG. 5, the first phase-locked module 2 outputs the first clock signal to the delay unit 11 of the time-to-digital converter 1, and the delay unit 11 delays the first clock signal and outputs the first clock signal to the first sampling unit 12.

In specific implementation, the first sampling unit 12 performs sampling on the first clock signal according to the input reference clock signal, and outputs the first phase signal to the first phase-locked module 2. For steps of performing sampling on the first clock signal by the first sampling unit 12, reference is made to the embodiment shown in FIG. 2 for details, which are not repeatedly described in this embodiment.

Optionally, a frequency of the reference clock signal is the same as a frequency of the second clock signal.

Optionally, the second clock signal received by the second sampling unit 13 is a second clock signal obtained after a synchronizer 4 changes a time sequence.

Because the first clock signal obtained by the second sampling unit 13 from the delay unit 11 is a delayed clock signal, the synchronizer 4 needs to change the time sequence of the input second clock signal to match the delayed first clock signal, so that the first clock signal subsequently output by the first phase-locked module 2 is synchronized with the second clock signal.

Optionally, the first phase detector 21 of the first phase-locked module 2 calculates a frequency error between the first clock signal and the second clock signal according to the first phase signal and the second clock signal.

In an implementable manner, the first phase detector 21 discriminates phase information of the second clock signal and the first phase signal, compares the phase of the first clock signal and a phase of the second clock signal, calculates the frequency error between the first clock signal and the second clock signal, and outputs a frequency error voltage.

Optionally, the first filter 22 of the first phase-locked module 2 controls, according to the frequency error, the numerically controlled oscillator 23 of the first phase-locked module 2 to adjust the first clock signal.

In an implementable manner, after the first filter 22 performs filtering on the frequency error voltage output by the first phase detector 21, a control voltage is obtained and output to the numerically controlled oscillator 23.

Optionally, the numerically controlled oscillator 23 adjusts, according to the frequency error, the frequency of the first clock signal to be the same as the frequency of the second clock signal.

In an implementable manner, the control voltage output by the first filter 22 acts on the numerically controlled oscillator 23, so that the numerically controlled oscillator 23 adjusts an oscillation frequency (that is, the frequency of the first clock signal) to be the same as the frequency of the second clock signal, where the oscillation frequency is output by the numerically controlled oscillator 23. When the two frequencies are equal, a loop of the first phase-locked module 2 is locked, and the frequency of the output first clock signal keeps the same with the frequency of the second clock signal.

Optionally, the frequency divider 24 of the first phase-locked module 2 performs frequency division on the frequency-adjusted first clock signal.

In an implementable manner, the frequency divider 24 performs frequency division on the frequency-adjusted first clock signal and adjusts a relationship between related coefficients, so that a first clock signal whose frequency is divided by the frequency divider 24 can match a related coefficient of a reference clock input by the first sampling unit 12, which facilitates sampling performed by the first sampling unit 12.

In specific implementation, the first phase-locked module 2 outputs the frequency-adjusted first clock signal to the delay unit 11 of the time-to-digital converter 1.

In specific implementation, the delay unit 11 outputs the frequency-adjusted first clock signal to the second sampling unit 13 of the time-to-digital converter 1. The second sampling unit 13 performs sampling on the frequency-adjusted first clock signal according to the input second clock signal, and outputs the second phase signal to the second phase-locked module 3. For steps of performing sampling on the second clock signal by the second sampling unit 13, reference is made to the embodiment shown in FIG. 2 for details, which are not repeatedly described in this embodiment.

Optionally, the second phase detector 31 of the second phase-locked module 3 calculates a phase error between the frequency-adjusted first clock signal and the second clock signal according to the second phase signal and the phase information of the second clock signal.

Optionally, the second filter 32 of the second phase-locked module 3 controls the numerically controlled oscillator 23 according to the phase error, so that the numerically controlled oscillator 23 adjusts, according to the phase error, a phase of the frequency-adjusted first clock signal to be the same as the phase of the second clock signal.

In an implementable manner, the second phase detector 31 is configured to discriminate the phase information of the second clock signal and the second phase signal, compare the phase of the frequency-adjusted first clock signal and the phase of the second clock signal, calculate the phase error between the first clock signal and the second clock signal, and output a phase error voltage.

In an implementable manner, after the second filter 32 performs filtering on the phase error voltage output by the second phase detector 31, a control voltage is obtained and acts on the numerically controlled oscillator 23 of the first phase-locked module 2, so that the phase of the first clock signal output by the numerically controlled oscillator 23 is the same as the phase of the second clock signal. In this case, a loop of the second phase-locked module 3 is locked, and the output first clock signal is synchronized with the second clock signal.

By implementing the method described in FIG. 6, a function of each of two time-to-digital converters in an existing double-loop frequency tracking system and a function of each component of a loop of the double-loop frequency tracking system can be implemented by using one time-to-digital converter, brand-new architecture is provided for the double-loop frequency tracking system, and power consumption and an occupied area of the system are reduced.

The described apparatus embodiment is merely exemplary. The units described as separate parts may or may not be physically separate, and parts displayed as units may or may not be physical units, may be located in one position, or may be distributed on a plurality of network units. Some or all of the modules may be selected according to actual requirements to achieve the objectives of the solutions of the embodiments. A person of ordinary skill in the art may understand and implement the embodiments of the present invention without creative efforts.

Order adjustment, combination, and deletion may be performed on steps in the method of the embodiment of the present invention according to an actual need.

Combination, division, and deletion may be performed on modules or units in the apparatuses of the embodiments of the present invention according to an actual need.

The modules or units in the embodiments of the present invention may be implemented in manner of a universal integrated circuit (such as a central processing unit CPU) or an application-specific integrated circuit (ASIC).

Based on the foregoing descriptions of the implementation manners, a person skilled in the art may clearly understand that each implementation manner may be implemented by software in addition to a necessary general hardware platform or by hardware. Based on such an understanding, the foregoing technical solutions essentially or the part contributing to the prior art may be implemented in a form of a software product. The computer software product is stored in a computer-readable storage medium, such as a ROM/RAM, a magnetic disk, or an optical disc, and includes several instructions for instructing a computer device (which may be a personal computer, a server, a network device, or the like) to perform the methods described in the embodiments or some parts of the embodiments.

The foregoing implementation manners are not intended to limit the protection scope of the technical solutions. Any modification, equivalent replacement, and improvement made without departing from the spirit and principle of the foregoing implementation manners shall fall within the protection scope of the technical solutions.

What is claimed is:

1. A time-to-digital converter, comprising:
a delay unit
a first sampling unit; and
a second sampling unit, wherein
   the delay unit is connected to the first sampling unit and is configured to: receive a first clock signal output by a first phase-locked module; and after delaying the first clock signal, output the first clock signal to the first sampling unit;
   the first sampling unit is configured to: perform, by using a reference clock signal, sampling on the first clock signal output by the delay unit; generate a first phase signal; and send the first phase signal to the first phase-locked module, so that the first phase-locked module adjusts a frequency of the first clock signal according to the first phase signal, and outputs a frequency-adjusted first clock signal to the delay unit;
   the delay unit is further connected to the second sampling unit and is configured to: receive the frequency-adjusted first clock signal output by the first phase-locked module; and after delaying the frequency-adjusted first clock signal, output the frequency-adjusted first clock signal to the second sampling unit; and
   the second sampling unit is configured to: perform, by using a second clock signal output by a synchronizer and having a time sequence changed by the synchronizer to match the frequency-adjusted first clock signal output by the delay unit, sampling on the frequency-adjusted first clock signal output by the delay unit; generate a second phase signal; and send the second phase signal to the first phase-locked module by using a second phase-locked module, so that the first phase-locked module adjusts a phase of the first clock signal according to the second phase signal.

2. A time-to-digital converter comprising:
a delay unit;
a first sampling unit; and
a second sampling unit, wherein
the delay unit is connected to the first sampling unit and is configured to: receive a first clock signal output by a first phase-locked module; and after delaying the first clock signal, output the first clock signal to the first sampling unit;
the first sampling unit is configured to: perform, by using a reference clock signal, sampling on the first clock signal output by the delay unit; generate a first phase signal; and send the first phase signal to the first phase-locked module, so that the first phase-locked module adjusts a frequency of the first clock signal according to the first phase signal, and outputs a frequency-adjusted first clock signal to the delay unit;
the delay unit is further connected to the second sampling unit and is configured to: receive the frequency-adjusted first clock signal output by the first phase-locked module; and after delaying the frequency-adjusted first clock signal, output the frequency-adjusted first clock signal to the second sampling unit; and
the second sampling unit is configured to: perform, by using a second clock signal, sampling on the frequency-adjusted first clock signal output by the delay unit; generate a second phase signal;
and send the second phase signal to the first phase-locked module by using a second phase-locked module, so that the first phase-locked module adjusts a phase of the first clock signal according to the second phase signal, wherein the delay unit comprises multiple delay elements that are successively connected, the first sampling unit and the second sampling unit comprise multiple triggers that are successively connected, and an output end of each delay element is connected to an input end of a next delay element, a phase collecting end of a trigger that is corresponding to the delay element and is in the first sampling unit, and a phase collecting end of a trigger that is corresponding to the delay element and is in the second sampling unit.

3. The time-to-digital converter according to claim 1, wherein a frequency of the reference clock signal is the same as a frequency of the second clock signal.

4. A frequency tracking apparatus, comprising:
a first phase-locked module;
a second phase-locked module; and
a time-to-digital converter comprising:
   a delay unit;
   a first sampling unit; and
   a second sampling unit, wherein
   the delay unit is connected to the first sampling unit and is configured to: receive a first clock signal output by a first phase-locked module; and after delaying the first clock signal, output the first clock signal to the first sampling unit;
   the first sampling unit is configured to: perform, by using a reference clock signal, sampling on the first clock signal output by the delay unit; generate a first phase signal; and send the first phase signal to the first phase-locked module, so that the first phase-locked module adjusts a frequency of the first clock signal according to the first phase signal, and outputs a frequency-adjusted first clock signal to the delay unit;
   the delay unit is further connected to the second sampling unit and is configured to: receive the frequency-adjusted first clock signal output by the first phase-locked module; and after delaying the frequency-adjusted first clock signal, output the frequency-adjusted first clock signal to the second sampling unit; and the second sampling unit is configured to: perform, by using a second clock signal, sampling on the frequency-adjusted first clock signal output by the delay unit; generate a second phase signal; and send the second phase signal to the first phase-locked module by using a second phase-locked module, so that the first phase-locked module adjusts a phase of the first clock signal according to the second phase signal, wherein a first end of the first phase-locked module is connected to the delay unit and is configured to output a first clock signal to the delay unit;

a second end of the first phase-locked module is connected to an end of the second phase-locked module and is configured to receive a second clock signal output by the second phase-locked module;

a third end of the first phase-locked module is connected to the first sampling unit and is configured to: receive a first phase signal output by the first sampling unit; adjust, according to the first phase signal and the second clock signal, a frequency of the first clock signal to be the same as a frequency of the second clock signal; and output a frequency-adjusted first clock signal to the delay unit by using the first end of the first phase-locked module; and another end of the second phase-locked module is connected to an end of the second sampling unit and is configured to receive a second phase signal output by the second sampling unit, so as to control the first phase-locked module to adjust, according to the second phase signal and the second clock signal, a phase of the frequency-adjusted first clock signal to be the same as a phase of the second clock signal, and output a phase-adjusted first clock signal to the delay unit by using the first end of the first phase-locked module.

5. The apparatus according to claim 4, wherein the apparatus further comprises a synchronizer, wherein an end of the synchronizer receives the second clock signal, another end of the synchronizer is connected to another end of the second sampling unit, and the synchronizer is configured to change a time sequence of the second clock signal, and output, to the second sampling unit, a second clock signal obtained after the time sequence is changed.

6. The apparatus according to claim 4, wherein the first phase-locked module comprises a first phase detector, a first filter, a numerically controlled oscillator, and a frequency divider, wherein the first phase detector comprises a first input end, a second input end, and an output end;

the first filter comprises an input end and an output end;

the numerically controlled oscillator comprises an input end and an output end;

the frequency divider comprises an input end and an output end;

the first input end of the first phase detector is the second end of the first phase-locked module, the second input end of the first phase detector is the third end of the first phase-locked module, the output end of the first phase detector is connected to the input end of the first filter, and the first phase detector is configured to calculate a frequency error between the first clock signal and the second clock signal according to the first phase signal and the second clock signal;

the output end of the first filter is connected to the input end of the numerically controlled oscillator, and the first filter is configured to control, according to the frequency error, the numerically controlled oscillator to adjust the first clock signal;

the output end of the numerically controlled oscillator is connected to the input end of the frequency divider, and the numerically controlled oscillator is configured to adjust, according to the frequency error, the frequency of the first clock signal to be the same as the frequency of the second clock signal; and the output end of the frequency divider is the first end of the first phase-locked module, and the frequency divider is configured to perform frequency division on the frequency-adjusted first clock signal.

7. The apparatus according to claim 4, wherein the second phase-locked module comprises a second phase detector and a second filter, wherein the second phase detector comprises an input end and an output end;

the second filter comprises an input end and an output end;

the input end of the second phase detector is the another end of the second phase-locked module, the output end of the second phase detector is connected to the input end of the second filter, and the second phase detector is configured to calculate a phase error between the frequency-adjusted first clock signal and the second clock signal according to the second phase signal and the input second clock signal; and the output end of the second filter is the end of the second phase-locked module, and the second filter is configured to control the numerically controlled oscillator according to the phase error, so that the numerically controlled oscillator adjusts, according to the phase error, the phase of the frequency-adjusted first clock signal to be the same as the phase of the second clock signal.

8. A frequency tracking method, comprising:

receiving, by a delay unit, a first clock signal output by a first phase-locked module; and after delaying the first clock signal, outputting the first clock signal to a first sampling unit;

performing, by the first sampling unit by using a reference clock signal, sampling on the first clock signal output by the delay unit; generating a first phase signal; and sending the first phase signal to the first phase-locked module, so that the first phase-locked module adjusts a frequency of the first clock signal according to the first phase signal, and outputs a frequency-adjusted first clock signal to the delay unit;

receiving, by the delay unit, the frequency-adjusted first clock signal output by the first phase-locked module; and after delaying the frequency-adjusted first clock signal, outputting the frequency-adjusted first clock signal to a second sampling unit;

performing, by the second sampling unit by using a second clock signal, sampling on the frequency-adjusted first clock signal output by the delay unit; generating a second phase signal; and sending the second phase signal to the first phase-locked module by using a second phase-locked module, so that the first phase-locked module adjusts a phase of the first clock signal according to the second phase signal;

changing, by a synchronizer, a time sequence of the second clock signal to match the frequency-adjusted first clock signal output by the delay unit; and outputting, by the synchronizer, to the second sampling unit, a second clock signal obtained after the time sequence is changed.

9. The method according to claim 8, a frequency of the reference clock signal is the same as a frequency of the second clock signal.

10. A frequency tracking method, comprising:
receiving, by a delay unit, a first clock signal output by a first phase-locked module; and after delaying the first clock signal, outputting the first clock signal to a first sampling unit;
performing, by the first sampling unit by using a reference clock signal, sampling on the first clock signal output by the delay unit; generating a first phase signal; and sending the first phase signal to the first phase-locked module, so that the first phase-locked module adjusts a frequency of the first clock signal according to the first phase signal, and outputs a frequency-adjusted first clock signal to the delay unit;
receiving, by the delay unit, the frequency-adjusted first clock signal output by the first phase-locked module; and after delaying the frequency-adjusted first clock signal, outputting the frequency-adjusted first clock signal to a second sampling unit; and
performing, by the second sampling unit by using a second clock signal, sampling on the frequency-adjusted first clock signal output by the delay unit; generating a second phase signal; and sending the second phase signal to the first phase-locked module by using a second phase-locked module, so that the first phase-locked module adjusts a phase of the first clock signal according to the second phase signal, wherein the second clock signal received by the second sampling unit is a second clock signal obtained after a synchronizer changes a time sequence.

11. A frequency tracking method, comprising:
receiving, by a delay unit, a first clock signal output by a first phase-locked module; and after delaying the first clock signal, outputting the first clock signal to a first sampling unit;
performing, by the first sampling unit by using a reference clock signal, sampling on the first clock signal output by the delay unit; generating a first phase signal; and sending the first phase signal to the first phase-locked module, so that the first phase-locked module adjusts a frequency of the first clock signal according to the first phase signal, and outputs a frequency-adjusted first clock signal to the delay unit;
receiving, by the delay unit, the frequency-adjusted first clock signal output by the first phase-locked module; and after delaying the frequency-adjusted first clock signal, outputting the frequency-adjusted first clock signal to a second sampling unit; and
performing, by the second sampling unit by using a second clock signal, sampling on the frequency-adjusted first clock signal output by the delay unit; generating a second phase signal; and sending the second phase signal to the first phase-locked module by using a second phase-locked module, so that the first phase-locked module adjusts a phase of the first clock signal according to the second phase signal, wherein the adjusting, by the first phase-locked module, a frequency of the first clock signal according to the first phase signal comprises:
calculating, by a first phase detector of the first phase-locked module, a frequency error between the first clock signal and the second clock signal according to the first phase signal and the second clock signal;
controlling, by a first filter of the first phase-locked module according to the frequency error, a numerically controlled oscillator of the first phase-locked module to adjust the first clock signal;
adjusting, by the numerically controlled oscillator according to the frequency error, the frequency of the first clock signal to be the same as the frequency of the second clock signal; and
performing, by a frequency divider of the first phase-locked module, frequency division on the frequency-adjusted first clock signal.

12. A frequency tracking method, comprising:
receiving, by a delay unit, a first clock signal output by a first phase-locked module; and after delaying the first clock signal, outputting the first clock signal to a first sampling unit;
performing, by the first sampling unit by using a reference clock signal, sampling on the first clock signal output by the delay unit; generating a first phase signal; and sending the first phase signal to the first phase-locked module, so that the first phase-locked module adjusts a frequency of the first clock signal according to the first phase signal, and outputs a frequency-adjusted first clock signal to the delay unit;
receiving, by the delay unit, the frequency-adjusted first clock signal output by the first phase-locked module; and after delaying the frequency-adjusted first clock signal, outputting the frequency-adjusted first clock signal to a second sampling unit; and
performing, by the second sampling unit by using a second clock signal, sampling on the frequency-adjusted first clock signal output by the delay unit; generating a second phase signal; and sending the second phase signal to the first phase-locked module by using a second phase-locked module, so that the first phase-locked module adjusts a phase of the first clock signal according to the second phase signal, wherein the adjusting, by the first phase-locked module, a phase of the first clock signal according to the second phase signal comprises:
calculating, by a second phase detector of the second phase-locked module, a phase error between the frequency-adjusted first clock signal and the second clock signal according to the second phase signal and the second clock signal; and
controlling, by a second filter of the second phase-locked module, the numerically controlled oscillator according to the phase error, so that according to the phase error, a phase of the frequency-adjusted first clock signal is adjusted to be the same as a phase of the second clock signal.

* * * * *